(12) United States Patent
    Kitagawa et al.

(10) Patent No.: US 6,831,462 B2
(45) Date of Patent: Dec. 14, 2004

(54) FLOOR COVER AND MR SYSTEM

(75) Inventors: Seiichi Kitagawa, Tokyo (JP); Yusuke Ikebe, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 10/123,763

(22) Filed: Apr. 16, 2002

(65) Prior Publication Data

US 2002/0149368 A1 Oct. 17, 2002

(30) Foreign Application Priority Data

Apr. 17, 2001 (JP) ........................................ 2001-118163

(51) Int. Cl.$^7$ ................................................. G01V 3/00
(52) U.S. Cl. ........................ 324/319; 324/324; 324/322
(58) Field of Search ................................ 324/319, 322, 324/318, 309; 600/410, 427; 335/301; 5/601, 600

(56) References Cited

U.S. PATENT DOCUMENTS

| 6,092,248 | A | * | 7/2000 | Boemmel et al. ............... 5/601 |
| 6,346,814 | B1 | * | 2/2002 | Carrozzi et al. ............ 324/318 |
| 6,381,780 | B1 | | 5/2002 | Nose et al. |
| 2002/0109991 | A1 | * | 8/2002 | Alsup ........................ 362/253 |

FOREIGN PATENT DOCUMENTS

| EP | 1 132 181 A1 | * | 2/2001 |
| JP | 72013516 B | * | 6/1968 |

* cited by examiner

Primary Examiner—Brij B Shrivastav
(74) Attorney, Agent, or Firm—Carl B. Horton, Esq.; Armstrong Teasdale LLP

(57) ABSTRACT

It is an object to provide an MR system and a floor cover capable of being attached and detached by one operator. In the invention, the floor cover covers a front face of a lower part of an open type MR system, and a cradle on which an object is mounted swiftly moves thereon. The floor cover is provided with a slide capable of moving on the lower part.

21 Claims, 7 Drawing Sheets

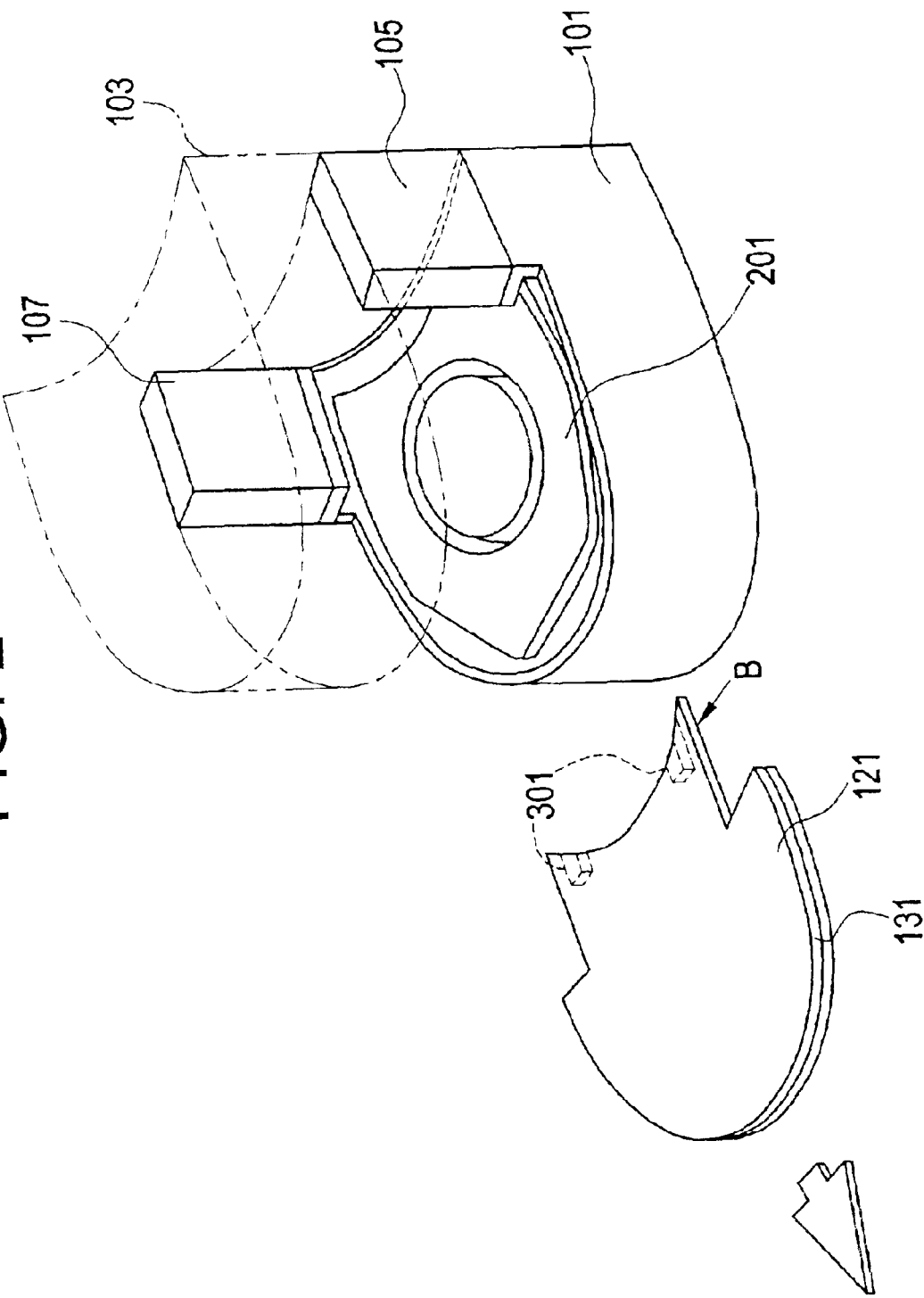

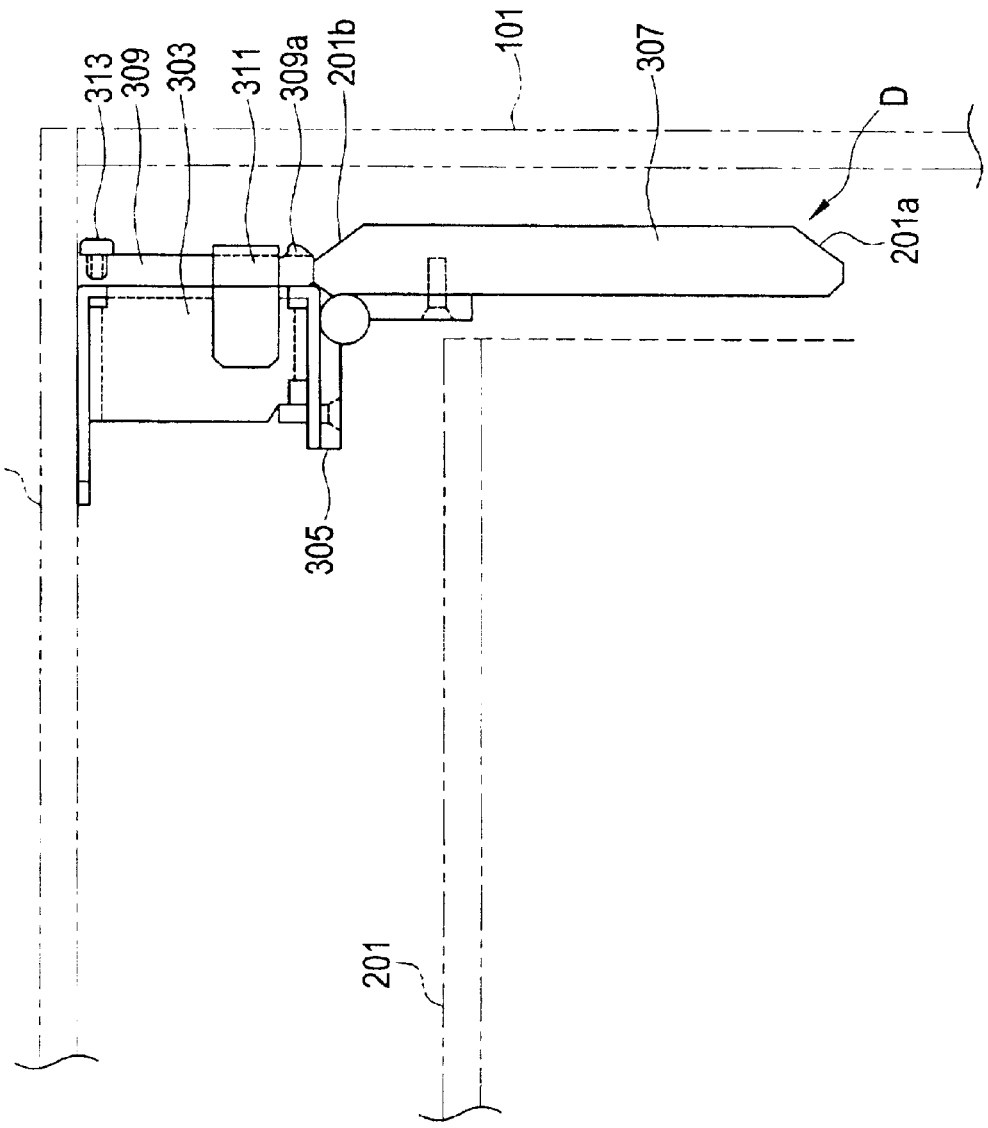

FLOOR COVER AND MR SYSTEM

CROSS REFERENCE TO RELATED APPLICATIONS

This application claims the benefit of Japanese Application No. 2001-118163 filed Apr. 17, 2001.

BACKGROUND OF THE INVENTION

The present invention relates to a floor cover, which covers a front face of a lower part of an open type MR (Magnetic Resonance) system and in which a cradle where an object is provided moves swiftly thereon, and an MR system.

Explanation is given with reference to FIG. 6 which is a perspective view of an open type MR system.

An open type MR system includes, in general, a lower part 1, an upper part 3, and two supporters 5 and 7 for supporting the upper part 3 by way of a space A on the lower part 1.

Inside the lower part 1 and the upper part 3, there are provided a magnet for causing an even static magnetic field in the space A and a receiving coil for receiving an MR signal from an object P.

The object P is placed in a cradle 13 provided in a table 11, and the object P is carried in and carried out of the space A of the MR system by the cradle 13 moving back and forth in the direction of an arrow I.

Here, the cradle 13 moves back and forth in the direction of the arrow I by sliding on the front face of the lower part 1.

Further, in order for the object to step on and off the cradle 13, a table 11 is capable of rising and falling in the direction of an arrow II.

Further, in order to make possible to carry the object P in the space A from an arbitrary direction to the MR system, the table 11 is capable of moving in the direction of an arrow III along the MR system.

The front face (floor) of the lower part 1 is a cover (a floor cover 21 is used hereinafter) which is capable of being attached and detached through the whole area of the floor in order to make it possible to check easily a magnet and a receiving coil of the inside. The cradle 13 moves swiftly on the floor cover 21.

Further, in the front edge portion of the floor cover 21, a touch sensor 31 to detect the collision of the cradle 13 and the like is provided.

In this touch sensor 31, a sensor body 33 is provided as shown in FIG. 7 as a sectional view taken along the cutting line A—A of FIG. 6, which includes a long bar type base 35 provided in an angle part of a front edge part of the floor cover 21 and a sensor cover 37 made of rubber covering the base 35 which is fixed to the floor cover 21 with a double-faced tape.

Since the floor cover 21 of the MR system structured in the aforementioned way has a wide area, it is not possible for one operator to attach and detach but two operators are required.

Here, as shown in FIG. 8, it is also possible to provide a floor cover 23 having the size in which it comes to be possible for one operator to attach and detach.

However, in such a case that this kind of floor cover 23 is provided, a channel G is made between the floor cover 23 and a peripheral floor, and thus an insanitary condition is caused since dust and the like go into this channel G.

Further, at the time that the cradle 13 passes above this channel G, another problem in which discomfort is caused.

SUMMARY OF THE INVENTION

Therefore the object the present invention is to provide the MR system and the floor cover capable of being attached and detached by one operator.

The invention according to the first aspect to solve the aforementioned problem is characterized in that a floor cover which is provided in an attaching and detaching way on a front face, on which a cradle moves swiftly, of a lower part of an open type MR system, includes a slide capable of moving on the lower part.

By providing the slide capable of moving on the lower part, it is possible to attach and detach the floor cover without help.

The invention according to the second aspect is the floor cover according to the first aspect, which is characterized in that the slide is fixed to a back face.

By fixing the slide to the back face, it is omitted to take a time for fixing and removing the slide, and thus the operability is improved.

The invention according to the third aspect is the floor cover according to the first or second aspect, which is characterized in that the slide is capable of being stored in the lower part.

Since the slide is capable of being stored in the lower part, it is possible to prevent the system from becoming large in size.

The invention according to the fourth aspect is the floor cover according to any one of the first to third aspects, which is characterized in that a table is capable of being attached to and detached from a front part of an MR system in which the table is provided.

By attaching to and detaching from a front part of the MR system in which the table having a space is provided, the operability is improved.

The invention according to the fifth aspect is the floor cover according to the fourth aspect, which is characterized in that the slide is provided in an end portion side of the MR system.

By providing the slide in the end portion side of the MR system, it is possible to attach and detach the floor cover in a stable condition at the time of attaching to and detaching from the front portion of the MR system.

The invention according to the sixth aspect is the floor cover of the MR system according to any one of the first to fourth aspects, which is characterized in that a plurality of the slides are provided.

By providing a plurality of the slides, a three-point supporting condition is attained in any event among a human being and plural slides, and thus it is possible to attach and detach in a stable condition.

The invention according to the seventh aspect is the floor cover according to any one of the first to sixth aspects, which is characterized in that the slide moves on a resin plate covering an upper portion of an internal instrument of the upper part.

Since the slide moves on the resin plate covering the upper part of the internal instruments in the upper part, it is possible to move smoothly.

The invention according to the eighth aspect is the floor cover according to anyone of the first to seventh aspects; which is characterized in that the slide includes a base provided in the back face of the floor cover and a slider provided in a rotatable way to the base, engaged with a space formed in the lower part at a time of storing, and capable of moving on the resin plate by rotating at a time of using.

Since the structure includes only the base and the slider, the cost becomes low.

Further, the slider engages with the space formed in the lower part at the time of storing, it cannot be supposed that the size of the MR system becomes large.

As the slider, it is possible to use an element, which slides on the resin plate in the same way as the invention according to the ninth aspect, or an element, which rolls and moves on the resin plate, such as a roller and a ball in the same way as the invention according to the twelfth aspect.

The invention according to the tenth aspect is the floor cover according to the ninth aspect, which is characterized in that the slider is made of low friction resin.

Since the slider is made of low friction resin, sliding resistance comes to be small and thus it is possible to move smoothly.

The invention according to the claim 11 is the floor cover according to the ninth or tenth aspect, which is characterized in that an angle between a top end face of the slider and the resin plate and an angle between an endmost face of the slider and the resin plate are obtuse respectively.

Since an angle between a top end face of the slider and the resin plate and an angle between an endmost face of the slider and the resin plate are obtuse respectively, it is possible to move smoothly even if there are a few concaves and projections on the resin plate.

Here, as the slider provided in a rotatable way to the base, an element, which rotates on the surface perpendicular to the floor face, may be possible in the same way as the invention according to the thirteenth aspect or an element, which rotates on the surface parallel to the floor face, may be possible in the same way as the invention according to the fourteenth aspect.

The invention according to the fifteenth aspect is the floor cover according to any one of the eighth to fourteenth aspects, which is characterized in that a stopper for prohibiting rotating of the slider at a time of using is provided.

Since the stopper for prohibiting rotating of the slider at the time of using is provided, it is possible to prevent any impossibility to move because the stopper spins while moving, and thus it is possible to move the floor cover smoothly.

The invention according to the sixteenth aspect is the MR system characterized in that the floor cover according to any one of the first to fifteenth aspects is included.

By including the floor cover according to any one of the first to fifteenth aspects, it is possible to attach and detach without help.

The following embodiment is also a preferable embodiment. (1) A structure which includes: a sensor body; a long bar type base provided in the front end part of the floor cover; and a sensor cover for covering the base; and forms: as a touch sensor provided in the front end portion of the floor cover, a projecting portion which forms a hooking space by cooperating with the floor cover in the side portion in the longitudinal direction of the base; and a claw part capable of engaging with the hooking space along the longitudinal direction in the sensor cover.

By structuring in this way, there is no variation per hour, when the case in which the sensor cover is fixed by the double-faced tape and the like is compared.

Further, since it is enough only to engage the claw part of the sensor cover with the hooking space, the operability comes to be good and further unevenness due to the degree of the skill of the user comes to be less.

Further, it is possible to produce using an extrusion molding method by forming the base and the sensor cover in the same sectional shape throughout the whole length, thereby to reduce cost.

According to the present invention, it is possible to provide the MR system and the floor cover capable of attaching and detaching without help.

Further objects and advantages of the present invention will be apparent from the following description of the preferred embodiments of the invention as illustrated in the accompanying drawings.

BRIEF DESCRIPTION OF THE DRAWINGS

FIG. 1 is a view showing a use condition of a slide of the embodiment, in which

FIG. 2 is a view showing the whole structure of an open type MR system of the embodiment and a condition in which a floor cover is taken off.

FIG. 3 illustrates a storing condition of FIG. 1.

DETAILED DESCRIPTION OF THE INVENTION

Figure 1A:
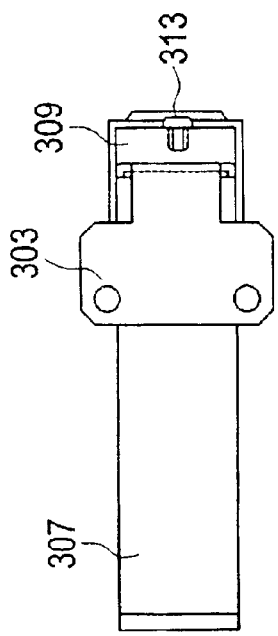
FIG. 1(a) is a view seen from the B direction of FIG. 2.

In the following, the example of the embodiment of the present invention is with reference to drawings.

First of all, with reference to FIG. 2 which illustrates a condition in which a floor cover is removed, a whole structure of an open type MR system for the case of the present embodiment is explained.

A visual shape of the open type MR system, in the same way as the conventional embodiment, includes in general a lower part 101, an upper part 103, two supporters 105 and 107 which support the upper part 103 through a space A on the lower part 101.

Inside the lower part 101 and the upper part 103, there are provided a magnet which forms even static magnetic fields in the space A, a receiving coil for receiving an MR signal from an object, and so forth.

Further, a resin plate 201, which covers the magnet and the coil, is provided in the lower part 101.

On the other hand, a slide 301 capable of sliding and moving on the resin-plate 201 is provided on the back face of a floor cover 121 for covering the upper surface of the lower part 101.

Further, a touch sensor 131 for detecting a conflict of a cradle and the like is provided in a front edge portion of the floor cover 121.

In the case of the present embodiment, since there is a space in the front portion in which a table not shown in the drawing is provided, two slides 301 are provided in the depth portion of the floor cover 121.

Figure 1B:
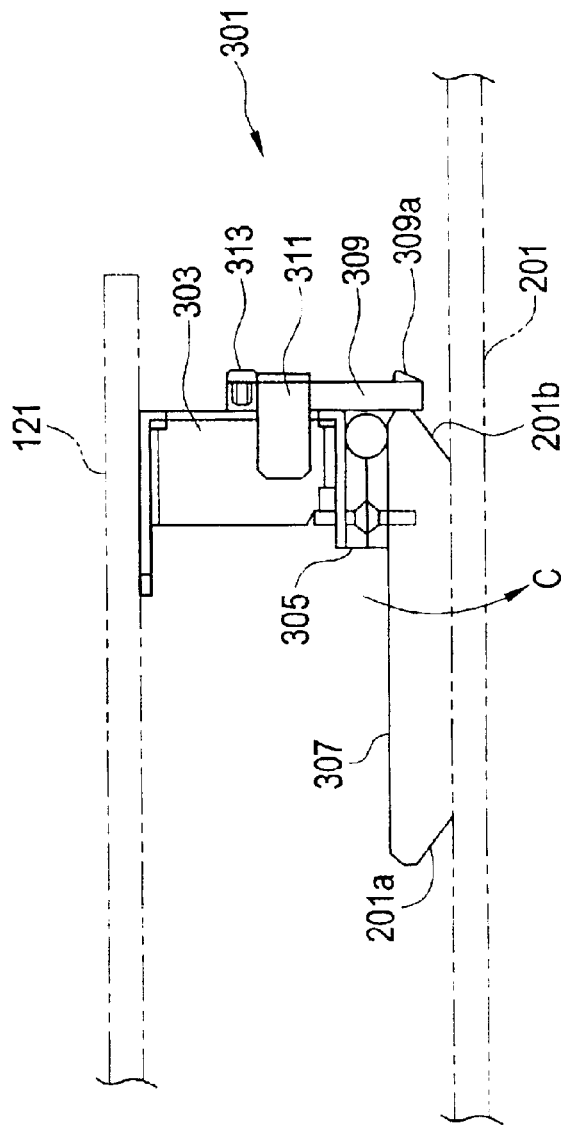
FIG. 1(b) is a top view of FIG. 1(a).

Next, the slide 301 is explained with reference to FIG. 1 which illustrates the condition of using the slide 301. At this point, FIG. 1(a) is a view observed from the B direction of FIG. 2, and FIG. 1(b) is a top view of FIG. 1(a).

A base 303 extending downward is fixed to the reverse side of the floor cover 121. A slider 307 made of resin having low frictional properties is fixed to the bottommost portion of the base 303 in a rotatable way by way of a hinge 305.

A top end face 201a and a back end face 201b of the slider 307 have tapered faces in which angles to the resin plate 201 are obtuse, even if there are a few concaves and projections on the resin plate 201, so as to override them.

At this point, since FIG. 1 indicates a use condition, it is possible for the slider 307 to slide on the resin plate 201.

On the base 303, a stopper 309 which touches with the slider 307 and prohibit the slider 307 from turning towards the direction of the arrow C is provided.

Further, for the turn of the slider 307 in the opposite direction of the arrow C, since the hinge 305 is in the condition of closing, it is in the prohibited condition to turn furthermore in the opposite direction of the arrow C.

On the base 303, a guide 311, in which a space in which the stopper 309 is inserted and passed by working together with the base 303 is formed, is provided. The stopper 309 is inserted and passed through the space formed by this guide 311 and the base 303, and thus it comes to be possible for the stopper 309 to move only in the upward and downward directions.

Furthermore, a projection 309a for prohibiting pullout is formed in the lower portion of the stopper 309, and a screw 313 for prohibiting being pulled out is formed in the upper portion of the stopper 309.

Next, the storing condition of the slide 301 is explained with reference to FIG. 3.

By moving the stopper 309 in the upward and downward directions, the slider 307 is turned and then engaged with a space D formed in the lower part 101.

Figure 4:
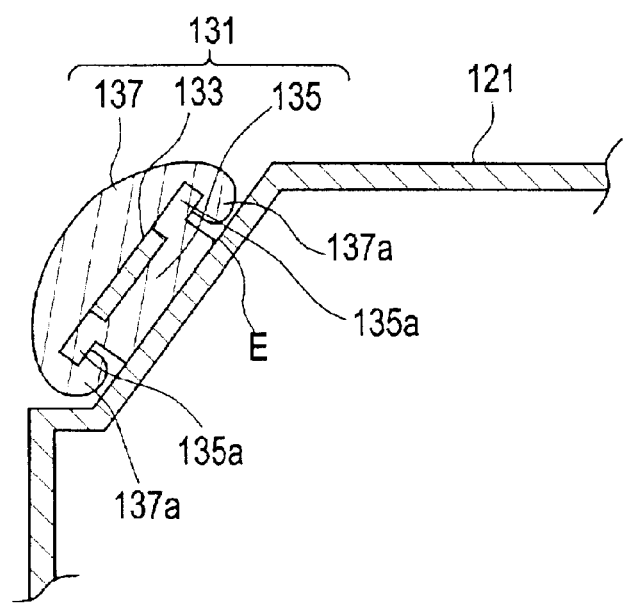
FIG. 4 is a sectional view of a touch sensor of FIG. 1.

Next, the touch sensor 131 is explained with reference to FIG. 4. FIG. 4 is a sectional view of the touch sensor 131 in FIG. 1.

The touch sensor 131 includes a sensor body 133, a long bar type elastic base 135 which provides this sensor body 133 and is formed in a front edge portion of the floor cover 121, and an elastic sensor cover 137 which covers the base 135.

A projecting portion 135a for forming a hooking space E by cooperating with the floor cover 121 is formed in the side of the base 135 in the longitudinal direction.

On the other hand, a claw part 137a capable of engaging with the hooking space E is provided in the sensor cover 137 in the longitudinal direction.

According to the structure, the following advantageous points can be obtained.

(1) It is possible to attach and detach the floor cover 121 without help, since the slide 301, which is capable of moving on the resin plate 201 on the lower part 101, is provided in the floor cover 121.
(2) Since two slides 301 are provided, a three-point support is made by a human being and two slides 301, and thus it is possible to attach and detach in a stable condition.
(3) The slide 301 includes the base 303, the slider 307, and the stopper 309, thus cost therefor can be reduced.
(4) Since the slider 307 engages with a space D formed in the lower part 101 at the time of storing, the size of an MR system will not become large.
(5) Since the stopper 309 for prohibiting turning of the slider 307 at the time of using is provided, it is possible to prevent the stopper 309 from rotating at the time of moving and then from not being removable, and thus it comes to be possible to obtain that the floor cover 121 moves smoothly.
(6) For the touch sensor 131, it is enough to engage the claw part 137a of the sensor cover 137 with a hooking space, and thus it is achieved to obtain the good efficiency of working and to cause less unevenness due to the degree of worker's skill.

Further, since the base 135 and the sensor cover 137 have the same sectional shape, it is possible, by employing resin or rubber having elastic characteristics as material, to produce by an extrusion molding method, and thus the price comes to be low.

At this point, the present invention is not limited to the aforementioned embodiment.

As the slider, it is also possible to use not only a sliding type on the resin plate 201 but also a rolling type using a roller, a ball, and the like.

Figure 5A:
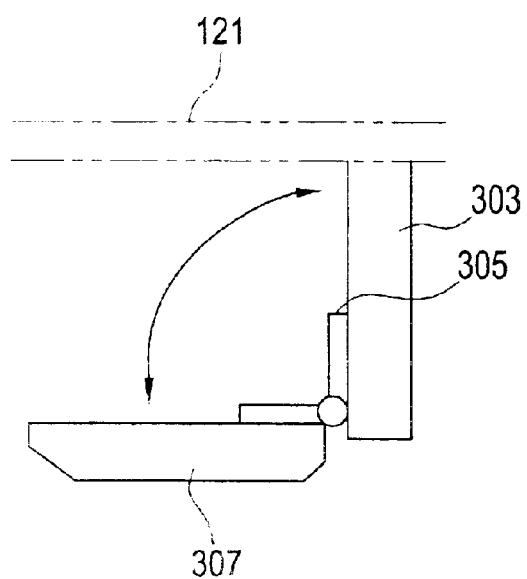
FIG. 5 is a view for explaining another embodiment.
Figure 5B:
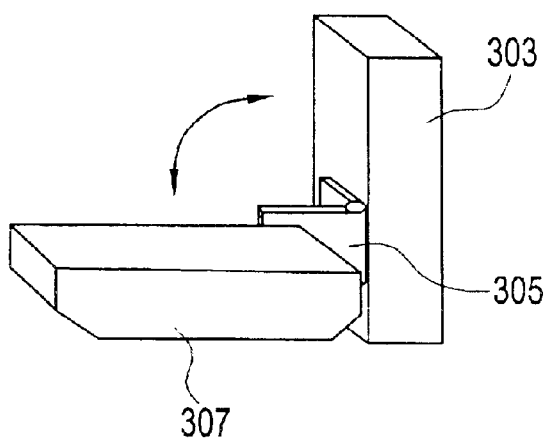
Figure 6:
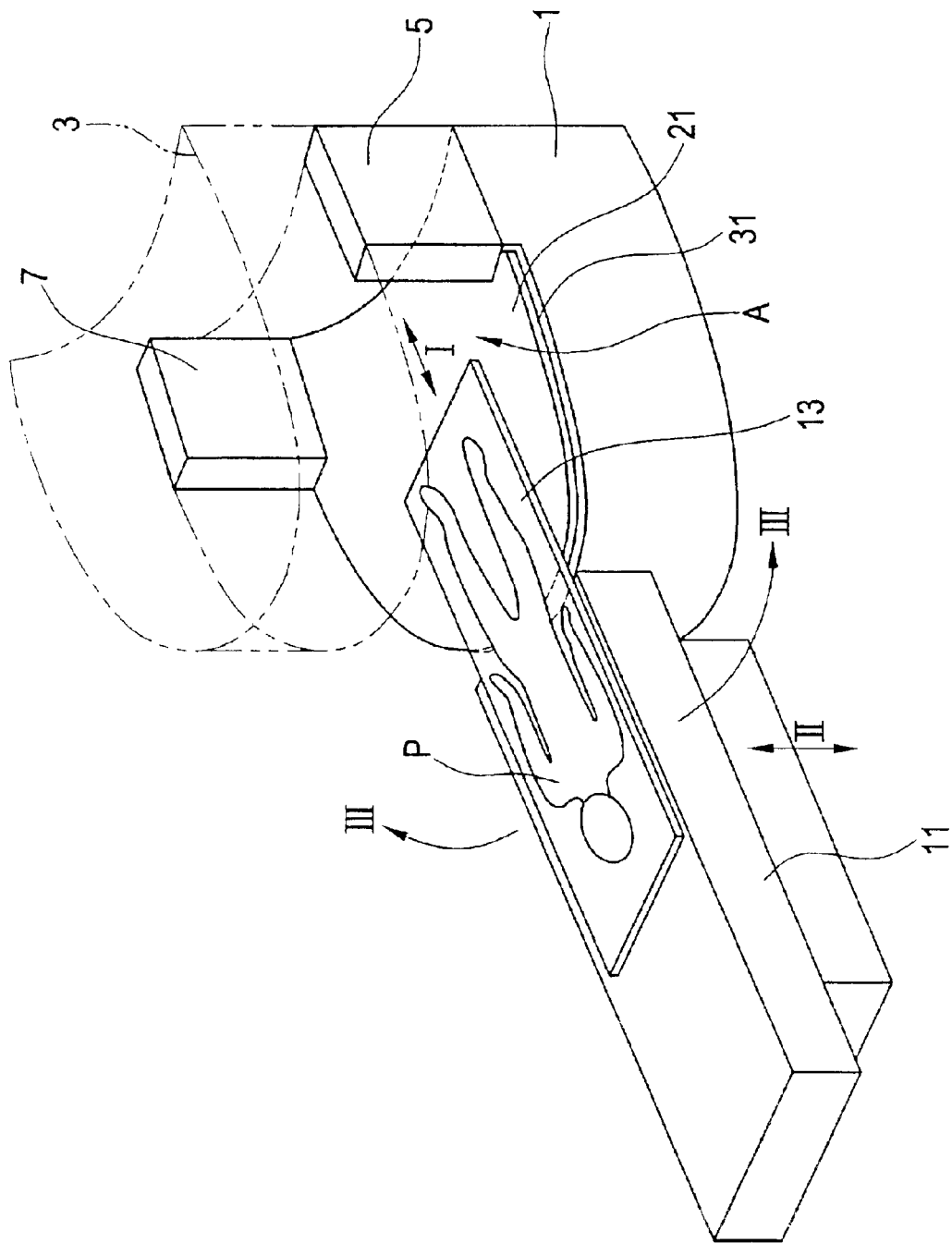
FIG. 6 is a perspective view of an open type MR system.
Figure 7:
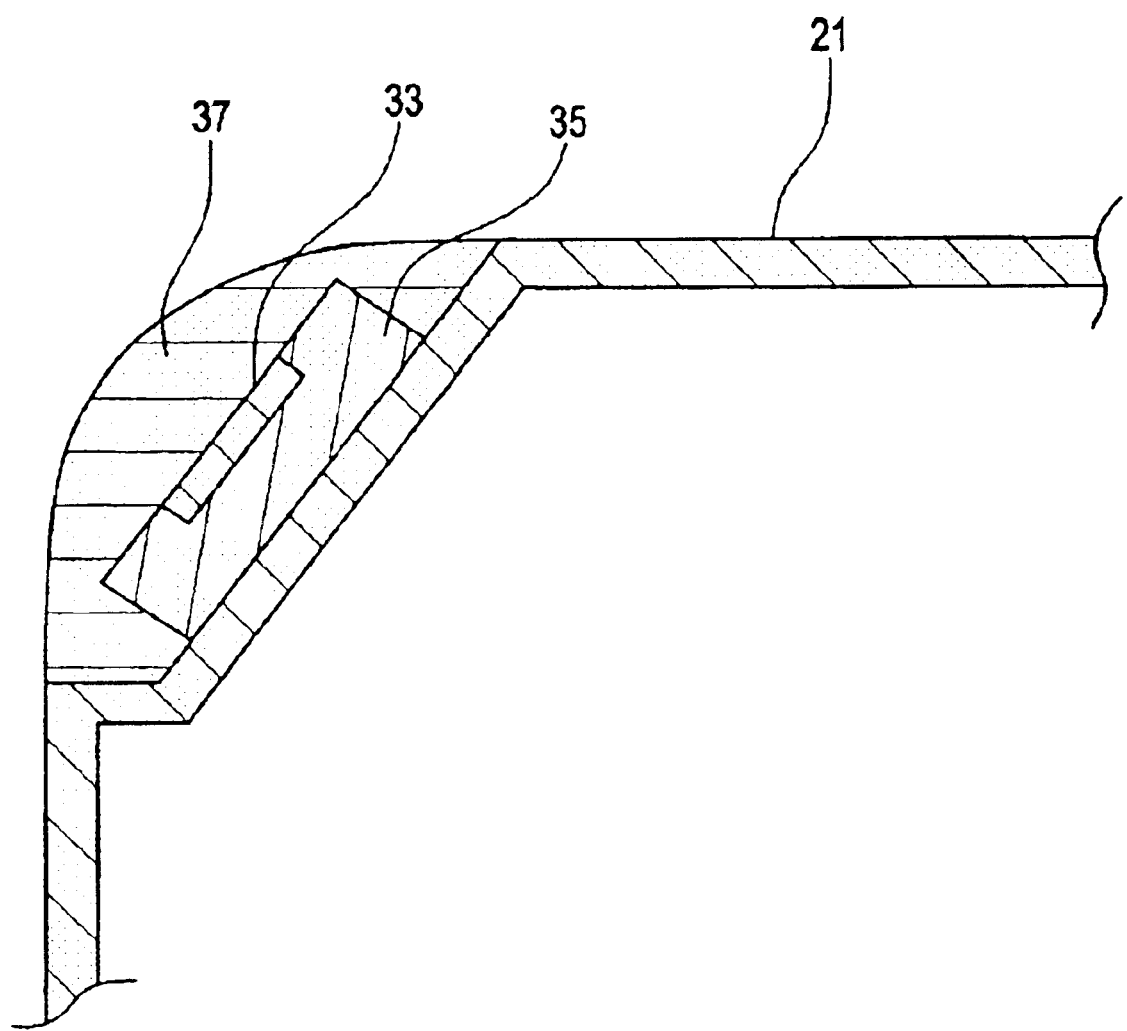
FIG. 7 is a sectional view taken along the cutting line A—A of FIG. 6.
Figure 8:
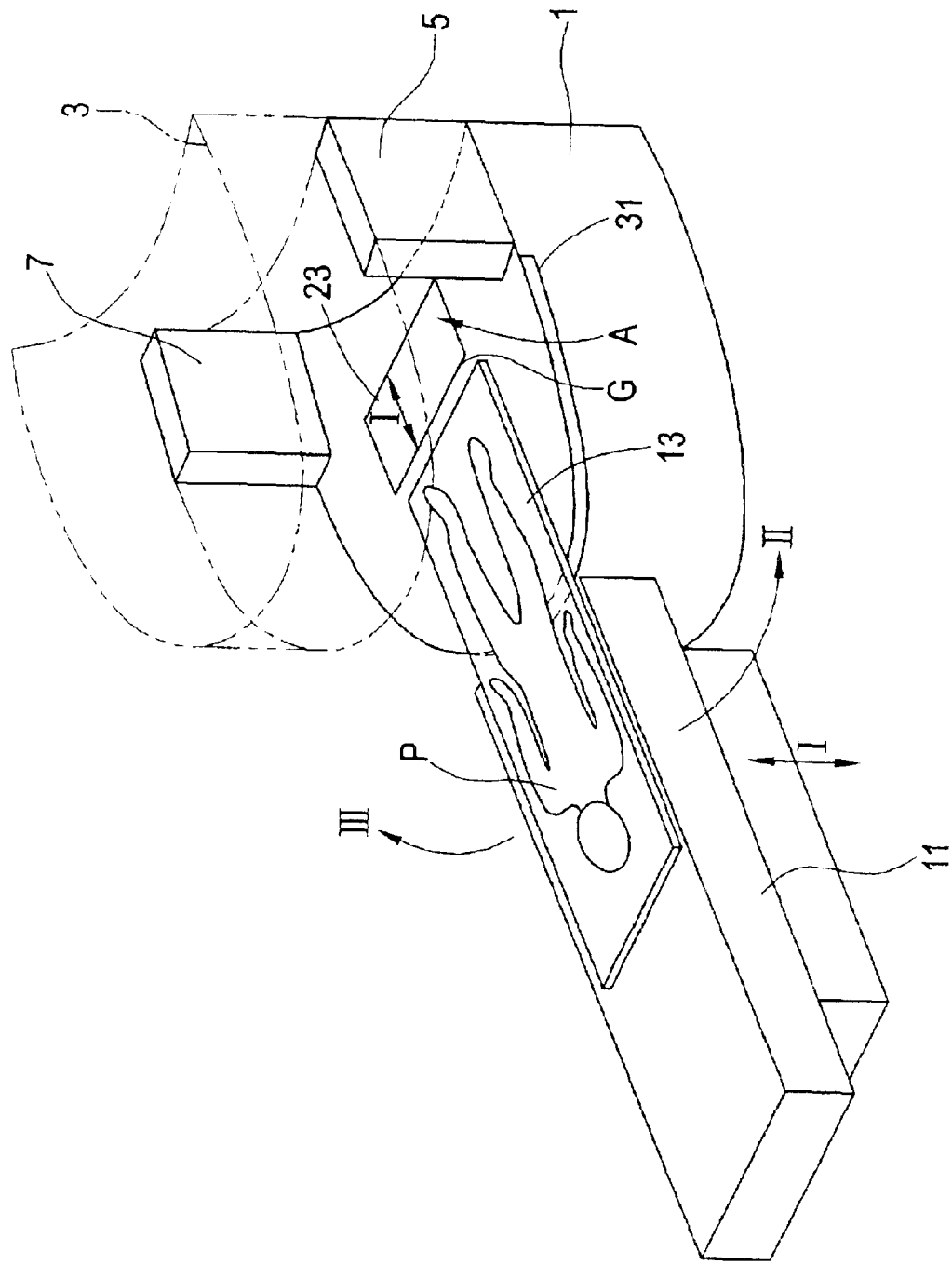
FIG. 8 is a view for explaining problems.

Further, in the embodiment, though it has been explained to engage with the space D formed in the lower portion at the time of storing, it is also possible to store in the upward direction as shown in FIG. 5(a) or in the horizontal direction as shown in FIG. 5(b).

Many widely different embodiments of the invention maybe configured without departing from the spirit and the scope of the present invention. It should be understood that the present invention is not limited to the specific embodiments described in the specification, except as defined in the appended claims.

What is claimed is:

1. A sliding system comprising:
   a slide provided on a face of a floor cover that covers a first part of a magnetic resonance (MR) system, wherein the slide is capable of moving on the first part, and capable of being stored inside the first part, and the first part includes a first magnet configured to generate a static magnetic field.
2. The sliding system of claim 1, wherein the slide is fixed to the face of the floor cover.
3. The sliding system of claim 1, wherein a table is capable of being attached to and detached from a second part of the MR system in which the table is provided.
4. The sliding system of claim 3, wherein the slide is located at a side of the MR system.
5. The sliding system according to claim 1, wherein a plurality of slides are provided, and the plurality of slides include the slide.
6. The sliding system of claim 1, wherein the slide moves on a resin plate covering a portion of an internal instrument of the first part.
7. The sliding system of claim 1, wherein the slide includes a base attached to the floor cover and a slider provided in a rotatable way to the base, engaged with a space formed in the first part at a time of storing, and capable of moving on the resin plate by rotating at a time of using.
8. The sliding system according to claim 7, wherein the slider slides on the resin plate.
9. The sliding system according to claim 8, wherein the slider is made of low friction resin.
10. The sliding system of claim 8, wherein an angle between a first end face of the slider and the resin plate and an angle between a second end face of the slider and the resin plate are obtuse respectively.
11. The sliding system of claim 7, wherein the slider moves on the resin plate.

12. The sliding system of claim 7, wherein the slider rotates on a surface perpendicular to the face of the floor cover.

13. The sliding system according to claim 7, wherein the slider rotates on a surface parallel to the face of the floor cover.

14. The sliding system of claim 7, wherein a stopper for prohibiting rotating of the slider at a time of using is provided.

15. The sliding system of claim 1 wherein the MR system comprises a second part that includes a second magnet, and the static magnetic field is generated in a space formed between the first and second magnets.

16. A magnetic resonance (MR) system comprising:
   a first part located below at least one support that supports a second part;
   a floor cover configured to be attached to and detached from a face of the first part; and
   a slide provided on a face of the floor cover and capable of moving on the first part, wherein at least a portion of the slide is configured to be stored within the first part included within said magnetic resonance system.

17. An MR system in accordance with claim 16 wherein the slide includes a base, a slider, and a stopper.

18. An MR system in accordance with claim 17 wherein the slider engages with a space formed in the first part.

19. An MR system in accordance with claim 17 wherein the stopper is configured to prohibit turning of the slider.

20. An MR system in accordance with claim 16 wherein the slider is configured to perform at least one of moving, sliding, and rolling on a resin plate provided in the first part.

21. An MR system in accordance with claim 20 wherein an obtuse angle is formed between a first end face of the slider and the resin plate and an obtuse angle is formed between a second end face of the slider and the resin plate.

* * * * *